United States Patent
Kwon et al.

(10) Patent No.: US 8,164,489 B2
(45) Date of Patent: Apr. 24, 2012

(54) KEY SCANNING CIRCUIT

(75) Inventors: Yong Il Kwon, Gyunggi-Do (KR);
Kyung Hee Hong, Seoul (KR); Sang Hoon Hwang, Seoul (KR); Tah Joon Park, Gyunggi-Do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 573 days.

(21) Appl. No.: 12/422,527

(22) Filed: Apr. 13, 2009

(65) Prior Publication Data

US 2010/0052952 A1   Mar. 4, 2010

(30) Foreign Application Priority Data

Sep. 2, 2008  (KR) .................. 10-2008-0086468

(51) Int. Cl.
*H03M 11/00* (2006.01)
(52) U.S. Cl. ........... 341/26; 340/1.1; 340/2.2; 340/2.28; 341/22
(58) Field of Classification Search ............ 341/20, 341/22, 26; 340/1.1, 2.2, 2.28
See application file for complete search history.

(56) References Cited

U.S. PATENT DOCUMENTS

| | | | | |
|---|---|---|---|---|
| 5,619,196 A * | 4/1997 | Escobosa | ................. | 341/22 |
| 5,983,116 A * | 11/1999 | Nash et al. | ................. | 455/575.1 |
| 6,424,274 B1 * | 7/2002 | Schnizlein et al. | ........... | 341/26 |
| 6,577,250 B1 * | 6/2003 | Yee | ................. | 341/26 |
| 6,737,990 B1 * | 5/2004 | Chau | ................. | 341/22 |
| 6,784,810 B2 * | 8/2004 | Falik et al. | ................. | 341/26 |

FOREIGN PATENT DOCUMENTS

| | | |
|---|---|---|
| JP | 2003-271291 A | 9/2003 |
| KR | 1999-00008898 U | 3/1999 |
| KR | 100724403 B | 6/2007 |
| WO | 2004032318 A1 | 4/2004 |

OTHER PUBLICATIONS

Korean Office Action for Application No. 10-2008-0086468, dated Feb. 10, 2010.

* cited by examiner

*Primary Examiner* — Albert Wong
(74) *Attorney, Agent, or Firm* — Lowe, Hauptman, Ham & Berner, LLP

(57) ABSTRACT

In a key scanning circuit, a key input unit has a parallel connection of a plurality of circuits having a series connection of resistors and switches between a power supply input terminal and a key scanning terminal. The resistors connected in parallel have different resistances. A current mirror has a first terminal connected to the key scanning terminal. A reference current source is connected between a second terminal of the current mirror and the power supply input terminal.

10 Claims, 2 Drawing Sheets

KEY SCANNING CIRCUIT

CROSS-REFERENCE TO RELATED APPLICATIONS

This application claims the priority of Korean Patent Application No. 2008-86468 filed on Sep. 2, 2008, in the Korean Intellectual Property Office, the disclosure of which is incorporated herein by reference.

BACKGROUND OF THE INVENTION

1. Field of the Invention

The present invention relates to a key scanning circuit, and more particularly, to a key scanning circuit designed to scan a state of a key input unit by using a current division, thereby reducing a leakage current and realizing miniaturization and simplicity of the circuit.

2. Description of the Related Art

An input device in which a plurality of keys are arranged has been used in a variety of electronic products. If a user presses a key arranged in the input device, a specific command can be input to the electronic product.

In such a key input device, on/off states of keys are usually recognized by a microprocessor. To this end, a plurality of keys are connected in a matrix configuration, and the microprocessor determines at which intersecting point a turned-on key is located by connecting an input terminal and an output terminal of the microprocessor at each intersecting point.

In the key scanning method using such a key matrix, however, a plurality of ports for recognizing the on/off states of the keys should be formed at the microprocessor. Thus, a microprocessor having much more ports should be used in order for input/output of different data, resulting in increase of a manufacturing cost and a substrate area.

SUMMARY OF THE INVENTION

An aspect of the present invention provides a key scanning circuit designed to scan a state of a key input unit by using a current division circuit, thereby reducing a leakage current and realizing miniaturization and simplicity of the circuit.

According to an aspect of the present invention, there is provided a key scanning circuit including: a key input unit having a parallel connection of a plurality of circuits having a series connection of resistors and switches between a power supply input terminal and a key scanning terminal, the resistors connected in parallel having different resistances; a current mirror having a first terminal connected to the key scanning terminal; and a reference current source connected between a second terminal of the current mirror and the power supply input terminal.

The first terminal of the current mirror may be connected to an external detecting unit detecting a key input signal.

The current mirror may be configured so that a current having the same magnitude as a current flowing through the reference current source is made to flow through the key input unit.

The current mirror may include: a first transistor having a drain connected to the key scanning terminal, and a source grounded; a second transistor having a drain connected to the reference current source, a source grounded, and a gate connected to the drain thereof and connected to a gate of the first transistor; and a capacitor having a first terminal commonly connected to the gates of the first and second transistors, and a second terminal grounded.

The current mirror may further include a third transistor connected between the drain and the source of the first transistor to remove a leakage current.

According to another aspect of the present invention, there is provided a key scanning circuit including: a key input unit having a parallel connection of a plurality of circuits having a series connection of resistors and switches between a power supply input terminal and a key scanning terminal, the resistors connected in parallel having different resistances; a current mirror having a first terminal connected to the key scanning terminal; and a reference resistor connected between a second terminal of the current mirror and the power supply input terminal.

The second terminal of the current mirror may be connected to an external detecting unit detecting a key input signal.

The current mirror may be configured so that a current having the same magnitude as a current flowing through the key input unit is made to flow through the reference resistor.

The current mirror may include: a first transistor having a drain connected to the reference resistor, and a source grounded; a second transistor having a drain connected to the key scanning terminal, a source grounded, and a gate connected to the drain thereof and connected to a gate of the first transistor; and a capacitor having a first terminal commonly connected to the gates of the first and second transistors, and a second terminal grounded.

The current mirror may further include: a third transistor connected between the key scanning terminal and the second transistor; and a fourth transistor connected between a source and a gate of the third transistor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
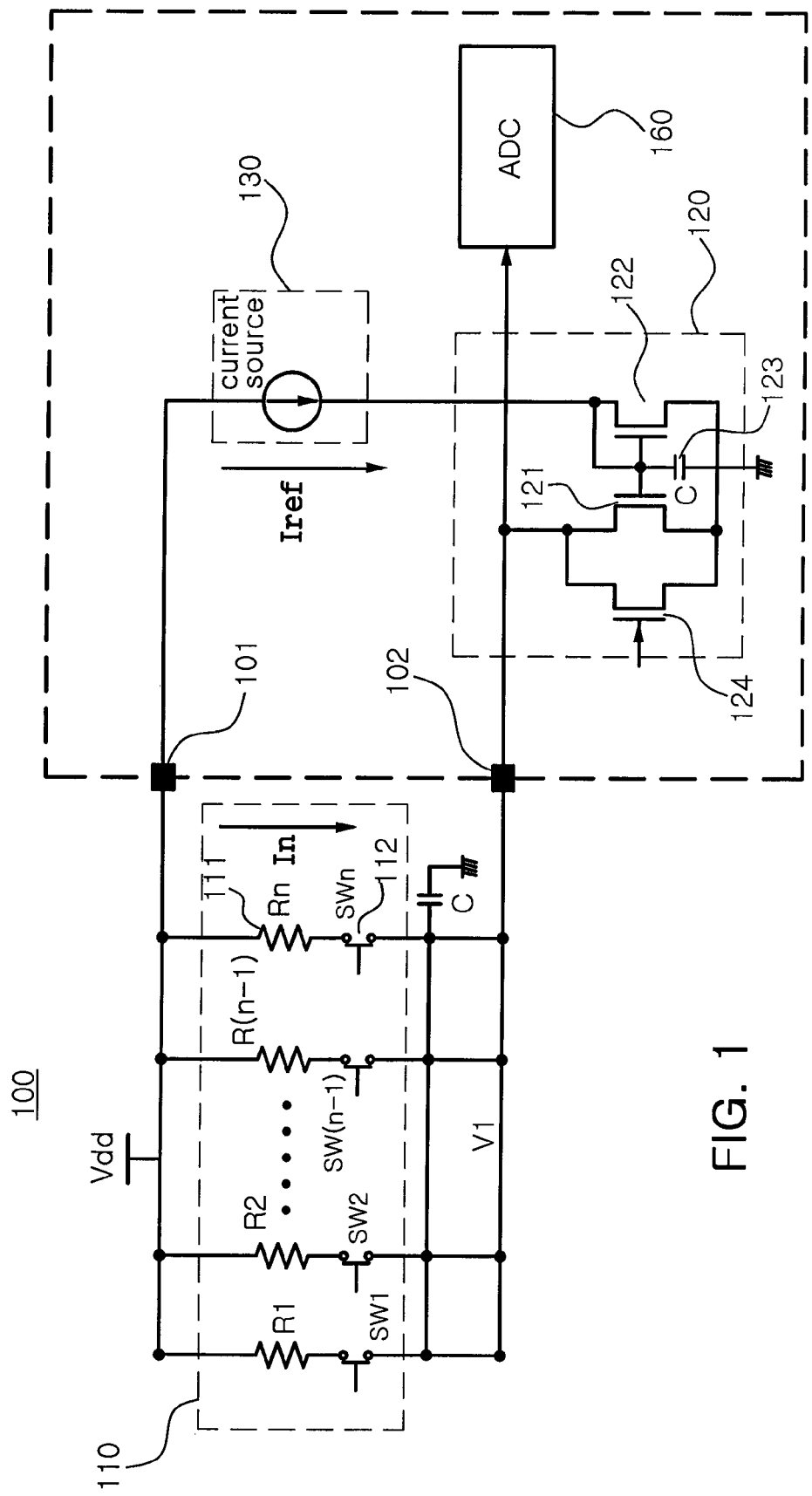
FIG. 1 is configuration diagram of a key scanning circuit according to an embodiment of the present invention.

FIG. 1 is a circuit diagram of a key scanning circuit according to an embodiment of the present invention.

Referring to FIG. 1, the key scanning circuit 100 according to the embodiment of the present invention may include a key input unit 110, a current mirror 120, and a reference current source 130.

The key input unit 110 may have a parallel connection of a plurality of circuits each having a series connection of a resistor 111 and a switch 112.

The key input unit 110 may have a first terminal connected to a power supply input terminal 101, and a second terminal connected to a key scanning terminal 102. In the key input unit 110, the plurality of resistors R1, R2, . . . , Rn connected in parallel may have different resistances. The switches SW1, SW2, . . . , SWn connected in series to the respective resistors R1, R2, . . . , Rn may be turned on/off according to key input. The power supply input terminal 101 and the key scanning terminal 102 may be electrically connected together according to the operation of the switches SW1, SW2, . . . , SWn.

The current mirror 120 may have a first terminal connected to the key scanning terminal 102, and a second terminal connected to the reference current source 130. Due to the current mirror 120, a current having the same magnitude as a current $I_{ref}$ flowing through the reference current source 130 can be made to flow through the key input unit 110.

In the current embodiment, the current mirror 120 may include: a first transistor 121 having a drain connected to the key scanning terminal 102, and a source grounded; a second transistor 122 having a drain connected to the reference current source 130, a source grounded, and a gate connected to the drain thereof and connected to a gate of the first transistor 121; and a capacitor 123 having a first terminal commonly connected to the gates of the first and second transistors 121 and 122, and a second terminal grounded.

In addition, the current mirror 120 may further include a third transistor 124 connected between the drain and the source of the first transistor 121. The third transistor 124 discharges a floating voltage derived from a parasitic capacitor by connecting the voltage of the key scanning terminal 102 to the ground, thereby preventing malfunctions. Also, the third transistor 124 can remove a leakage current by turning off the reference current source 130.

The current mirror 120 may be implemented in various manners only if the current having the same magnitude as the current flowing through the reference current source 130 can be made to flow through the key input unit 110.

A detailed operation principle of the key scanning circuit 100 will be described below.

First, when an external power supply voltage $V_{dd}$ is connected to the power supply input terminal 101 and one switch of the key input unit 110 is turned on, the power supply input terminal 101 and the key scanning terminal 102 are electrically connected together so that a reference current $I_{ref}$ is generated from the reference current source 130.

Due to the current mirror 120, the current $I_n$ having the same magnitude as the reference current $I_{ref}$ flowing through the reference current source 130 may flow through the turned-on switch of the key input unit 110.

In this case, since the magnitude of the current $I_n$ flowing through the key input unit 110 has been already determined by the reference current $I_{ref}$, the magnitude of the voltage applied to the key input unit 110 may be changed according to the resistance of the resistor connected to the turned-on switch of the key input unit 110. That is, when the switch SW1 is turned on, the voltage corresponding to the product of the resistance of the resistor R1 connected to the switch SW1 and the reference current $I_{ref}$ may be applied to the key input unit 110.

Therefore, an equation for measuring the voltage at the key scanning terminal 102 may be expressed as follows:

$$V_1 = V_{dd} - I_n \times R_n = V_{dd} - I_{ref} \times R_n \quad (1)$$

where $V_1$: the voltage at the key scanning terminal 102
$V_{dd}$: the voltage at the power supply input terminal 101
$R_n$: the resistance of a resistor connected in series to the turned-on switch
$I_n$: the current flowing through the above resistor with the reference $R_n$ As described above, the current $I_n$ may have the same magnitude as the current $I_{ref}$ flowing through the reference current source 130.

In the current embodiment, as described above, the switch may be turned on by the key input at the key input unit 110, and thus the power supply input terminal 101 and the key scanning terminal 102 may be electrically connected together. The voltage at the key scanning terminal 102 can be obtained because the current flowing through the resistor connected to the turned-on switch is equal to the current flowing through the reference current source 130.

At the key input unit 110, since the plurality of circuits each having the series connection of the resistor and the switch are connected in parallel, any one switch can be operated to an on-state upon an external key input. When any one of the switches SW1, SW2, . . . , SWn connected in parallel at the key input unit 110 is turned on, a voltage difference between the power supply input terminal 101 and the key scanning terminal 102 may be determined by the resistor connected to the turned-on switch.

Since the voltage at the key scanning terminal 102 is different according to the switching operation of the key input unit 110, the operation state of the key input unit 110 can be measured from the voltage at the key scanning terminal 102 by connecting the key scanning terminal 102 to an external detecting unit 160. That is, the key input can be scanned by detecting which switch is turned on among the plurality of switches formed in the key input unit 110. The external detecting unit may be an analog-to-digital converter (ADC).

In the current embodiment, as described above, the operation state of the key input unit 110 can be detected by measuring the voltage at the key scanning terminal 102. Thus, the number of ports to be connected to the microprocessor can be reduced, thus contributing to the miniaturization and simplicity of the circuit.

Furthermore, since the operation state of the key input unit is scanned by using the current mirror and the current division, a leakage current can be reduced more than the case of a voltage division. Thus, if the key scanning circuit according to the current embodiment is used in an RF remote controller supporting a sleep mode, the lifespan of the remote controller can be expanded.

Figure 2:
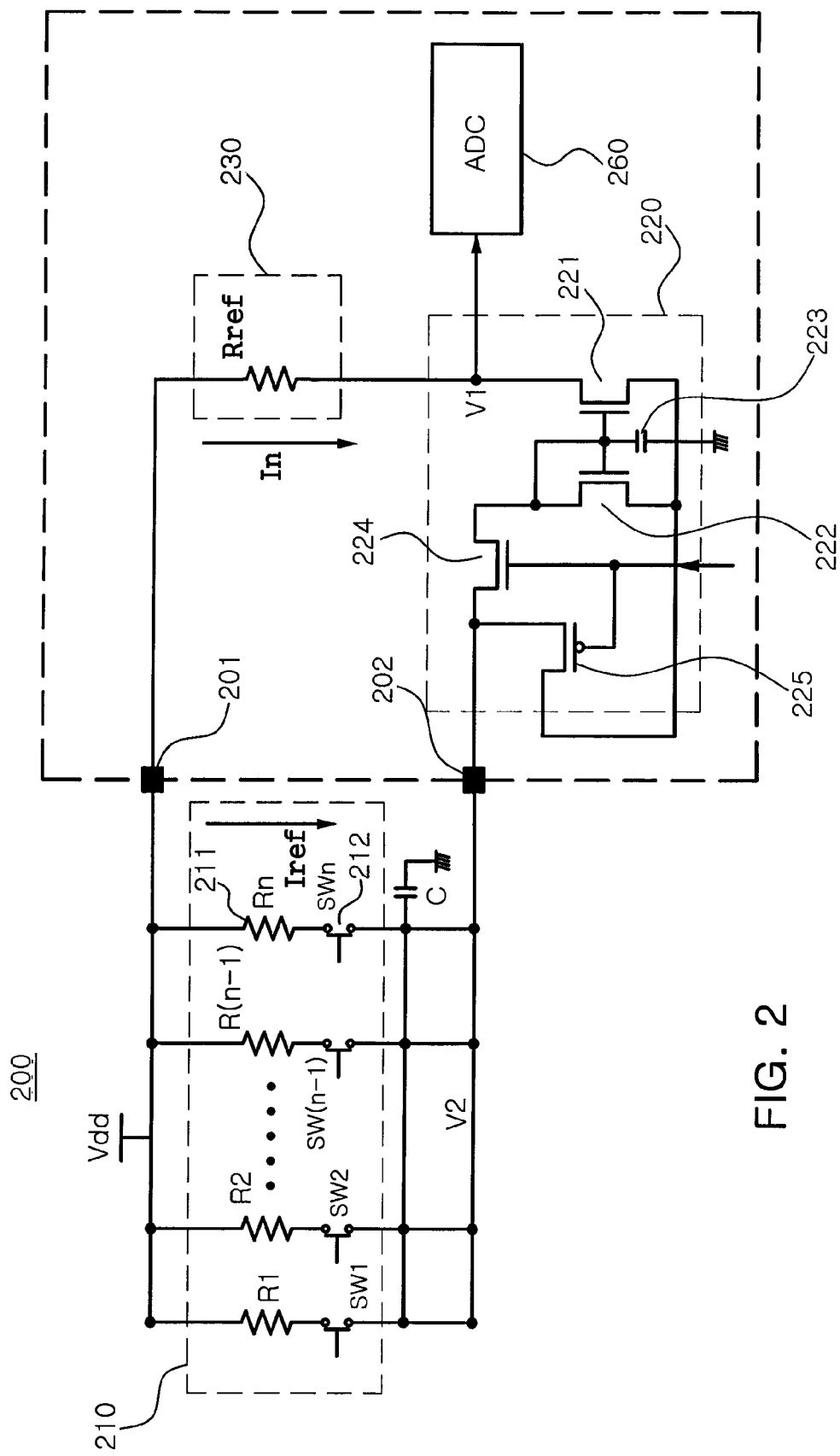
FIG. 2 is a configuration diagram of a key scanning circuit according to another embodiment of the present invention.

FIG. 2 is a circuit diagram of a key scanning circuit according to another embodiment of the present invention.

Referring to FIG. 2, the key scanning circuit 200 according to another embodiment of the present invention may include a key input unit 210, a current mirror 220, and a reference resistor 230.

The key input unit 210 may have a parallel connection of a plurality of circuits each having a series connection of a resistor 211 and a switch 212.

The key input unit 210 may have a first terminal connected to a power supply input terminal 201, and a second terminal connected to a key scanning terminal 202. In the key input unit 210, the plurality of resistors R1, R2, . . . , Rn connected in parallel may have different resistances. The switches SW1, SW2, . . . , SWn connected in series to the respective resistors R1, R2, . . . , Rn may be turned on/off according to key input. The power supply input terminal 201 and the key scanning terminal 202 may be electrically connected according to the operation of the switches SW1, SW2, . . . , SWn.

The current mirror 220 may have a first terminal connected to the key scanning terminal 202, and a second terminal connected to the reference resistor 230. Due to the current mirror 220, a current having the same magnitude as a current $I_{ref}$ flowing through the key input unit 210 can be made to flow through the reference resistor 230.

In the current embodiment, the current mirror 220 may include: a first transistor 221 having a drain connected to the reference resistor 230, and a source grounded; a second transistor 222 having a drain connected to the key scanning terminal 202, a source grounded, and a gate connected to the drain thereof and connected to a gate of the first transistor 221; and a capacitor 223 having a first terminal commonly connected to the gates of the first and second transistors 221 and 222, and a second terminal grounded.

In addition, the current mirror 220 may further include: a third transistor 224 connected between the key scanning terminal 202 and the second transistor 222; and a fourth transistor 225 connected between a source and a gate of the third transistor 224.

The third and fourth transistors 224 and 225 remove a leakage current by making the reference current $I_{ref}$ zero. Furthermore, the third and fourth transistors 224 and 225 discharges a floating voltage derived from a parasitic capacitor by connecting the voltage of the key scanning terminal 202 to the ground, thereby preventing malfunctions.

The current mirror 220 may be implemented in various manners only if the current having the same magnitude as the current flowing through the key input unit 210 can be made to flow through the reference resistor 230.

A detailed operation principle of the key scanning circuit 200 will be described below.

First, when an external power supply voltage $V_{dd}$ is connected to the power supply input terminal 201 and one switch of the key input unit 210 is turned on, the power supply input terminal 201 and the key scanning terminal 202 are electrically connected together to generate the reference current $I_{ref}$ flowing through the key input unit 210.

Due to the current mirror 220, the current $I_n$ having the same magnitude as the reference current $I_{ref}$ flowing through the key input unit 210 can flow through the reference resistor 230.

In this case, the magnitude of the current $I_{ref}$ flowing through the key input unit 210 may be changed according to the resistance of the resistor connected to the turned-on switch of the key input unit 210. In addition, the voltage applied to the key input unit 210 may be changed according to the turned-on switch. That is, when the switch SW1 is turned on, the voltage corresponding to the product of the resistance of the resistor R1 connected to the switch SW1 and the reference current $I_{ref}$ may be applied to the key input unit 210.

Due to the current mirror 220, the current $I_n$ flowing through the reference resistor 230 is equal to the current $I_{ref}$ flowing through the key input unit 210. Thus, an equation for measuring the voltage at the reference resistor 230 may be expressed as follows:

$$V_1 = V_{dd} - I_n \times R_{ref} = V_{dd} - I_{ref} \times R_{ref} \quad (2)$$

where $V_1$: the voltage at the first terminal of the reference resistor 230

$V_{dd}$: the voltage at the power supply input terminal 201

$R_{ref}$: the resistance of the reference resistor $I_n$: the current flowing through the reference resistor As described above, the current $I_n$ may have the same magnitude as the current $I_{ref}$ flowing through the key input unit 210.

In the current embodiment, as described above, the switch may be turned on by the key input at the key input unit 210, and thus the current may flow between the power supply input 201 and the key scanning terminal 202. At this point, the current $I_{ref}$ flowing through the resistor connected to the turned-on switch may be the reference current.

At the key input unit 210, since the plurality of circuits each having the series connection of the resistor and the switch are connected in parallel, one switch can be operated to an on-state upon an external key input. When any one of the switches SW1, SW2, . . . , SWn connected in parallel at the key input unit 210 is turned on, a current $I_{ref}$ flowing between the power supply input terminal 201 and the key scanning terminal 202 may be changed according to the resistor connected to the turned-on switch.

Therefore, the current $I_n$ flowing through the reference resistor 230 may also be changed according to the resistor connected to the turned-on switch in the key input unit 210, and the voltage V1 at the first terminal of the reference resistor 230 may be determined by the resistor of the key input unit 210.

In the current embodiment, the first terminal of the reference resistor 230 is connected to an external detecting unit 260, and the operation state of the key input unit 210 can be detected by the voltage at the first terminal of the reference resistor 230. That is, the key input can be scanned by detecting which switch is turned on among the plurality of switches formed in the key input unit 210. The external detecting unit 260 may be an analog-to-digital converter (ADC).

Since the operation state of the key input unit 210 is scanned by measuring only the voltage at the first terminal of the reference resistor 230, the number of ports to be connected to the microprocessor can be reduced, thus contributing to the miniaturization and simplicity of the circuit.

Furthermore, since the operation state of the key input unit 210 is scanned by using the current mirror and the current division, a leakage current can be reduced more than the case of a voltage division. Thus, if the key scanning circuit according to the current embodiment is used in an RF remote controller supporting a sleep mode, the lifespan of the remote controller can be expanded.

The key scanning circuit according to the embodiments of the present invention can scan the state of the key input unit by using the current division circuit, thereby reducing a leakage current and realizing miniaturization and simplicity of the circuit.

While the present invention has been shown and described in connection with the exemplary embodiments, it will be apparent to those skilled in the art that modifications and variations can be made without departing from the spirit and scope of the invention as defined by the appended claims.

What is claimed is:

1. A key scanning circuit comprising:
a key input unit having a parallel connection of a plurality of circuits having a series connection of resistors and switches between a power supply input terminal and a key scanning terminal, the resistors connected in parallel having different resistances;
a current mirror having a first terminal connected to the key scanning terminal; and
a reference current source connected between a second terminal of the current mirror and the power supply input terminal.

2. The key scanning apparatus of claim 1, wherein the first terminal of the current mirror is connected to an external detecting unit detecting a key input signal.

3. The key scanning circuit of claim 1, wherein the current mirror is configured so that a current having the same magnitude as a current flowing through the reference current source is made to flow through the key input unit.

4. The key scanning circuit of claim 3, wherein the current mirror comprises:
a first transistor having a drain connected to the key scanning terminal, and a source grounded;
a second transistor having a drain connected to the reference current source, a source grounded, and a gate connected to the drain thereof and connected to a gate of the first transistor; and a capacitor having a first terminal commonly connected to the gates of the first and second transistors, and a second terminal grounded.

5. The key scanning circuit of claim 4, wherein the current mirror further comprises a third transistor connected between the drain and the source of the first transistor to remove a leakage current.

6. A key scanning circuit comprising:

a key input unit having a parallel connection of a plurality of circuits having a series connection of resistors and switches between a power supply input terminal and a key scanning terminal, the resistors connected in parallel having different resistances;

a current mirror having a first terminal connected to the key scanning terminal; and a reference resistor connected between a second terminal of the current mirror and the power supply input terminal.

7. The key scanning apparatus of claim 6, wherein the second terminal of the current mirror is connected to an external detecting unit detecting a key input signal.

8. The key scanning circuit of claim 6, wherein the current mirror is configured so that a current having the same magnitude as a current flowing through the key input unit is made to flow through the reference resistor.

9. The key scanning circuit of claim 8, wherein the current mirror comprises:

a first transistor having a drain connected to the reference resistor, and a source grounded;

a second transistor having a drain connected to the key scanning terminal, a source grounded, and a gate connected to the drain thereof and connected to a gate of the first transistor; and a capacitor having a first terminal commonly connected to the gates of the first and second transistors, and a second terminal grounded.

10. The key scanning circuit of claim 9, wherein the current mirror further comprises:

a third transistor connected between the key scanning terminal and the second transistor; and a fourth transistor connected between a source and a gate of the third transistor.

* * * * *